United States Patent
Felker et al.

(10) Patent No.: US 6,508,948 B2
(45) Date of Patent: Jan. 21, 2003

(54) CYANURIC FLUORIDE AND RELATED COMPOUNDS FOR ANISOTROPIC ETCHING

(75) Inventors: Brian Scott Felker, Orefield, PA (US); Ronald Martin Pearlstein, Macungie, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 7 days.

(21) Appl. No.: 09/880,157

(22) Filed: Jun. 13, 2001

(65) Prior Publication Data

US 2002/0190027 A1 Dec. 19, 2002

(51) Int. Cl.$^7$ ............................................... H01L 21/302
(52) U.S. Cl. .............................. 216/63; 216/67; 216/71; 438/710; 438/714
(58) Field of Search .............................. 216/63, 67, 71; 438/710, 714

(56) References Cited

U.S. PATENT DOCUMENTS

| | | |
|---|---|---|
| 5,770,098 A | 6/1998 | Araki et al. .................. 216/67 |
| 5,814,563 A | 9/1998 | Ding et al. .................. 438/714 |
| 5,843,847 A | 12/1998 | Pu et al. ..................... 438/723 |
| 6,174,451 B1 | 1/2001 | Hung et al. .................. 216/67 |

OTHER PUBLICATIONS

"Toxicological Hazards of Plasma Etching Waste Products"; Solid State Technology (1996); 39(7); pp 97–104; Bauer et. al.*
"An ESCA Study of the Inductively . . . ", J. Poly. Sci.: Polym. Chem. Ed. 1984, V. 22, pp. 2661–2666.
"Polymerization in Fluorocarbon Plasma," E. Stoffels, et al, Puraz., Kaku Yugo Gakkaishi, 1999. pp. 800–812.

* cited by examiner

*Primary Examiner*—George Goudreau
(74) *Attorney, Agent, or Firm*—Geoffrey L. Chase

(57) ABSTRACT

A method for etching features into a substrate by removing substrate material from selected areas while leaving the substrate substantially unaffected in other areas is provided including the steps of providing the substrate to be etched into a process chamber, providing a patterned mask on the substrate as a guide for selective removal of the substrate, the substrate having a mask area and mask-free area, introducing a chemical species of halogenated heterocylic hydrocarbons into the process chamber, applying excitation energy to the process chamber to cause the chemical species to dissociate and form reactive ions and neutral species, and maintaining an electric potential gradient in an area adjacent the substrate to impose directionality and anisotropy to the etch.

34 Claims, 1 Drawing Sheet

CYANURIC FLUORIDE AND RELATED COMPOUNDS FOR ANISOTROPIC ETCHING

BACKGROUND OF THE INVENTION

The present invention is directed to methods for performing microfabrication of semiconductor based logic, memory and optoelectronic devices and micromechanical systems. In particular, the present invention is directed to microfabrication using anisotropic etching.

Microfabrication techniques are used, for example, to manufacture semiconductor-based logic, memory and optoelectronic devices, and microelectromechanical (MEMS) systems. There has been an ongoing trend toward miniaturization and optimization of these devices such that ever more stringent control is required over their geometries. One method widely applied to achieve these geometries is a process where a lithographic mask is generated on a surface and then features are etched into the surface of the underlying substrate. In order to get a faithful replica of the mask to be etched in the underlying layer, the etching process must have a high degree of anisotropy. That is, the etching rate perpendicular to the surface, as opposed to other directions relative to the surface, must be predominant. Chemical etching is undesirable since it tends to be mostly isotropic (i.e., identical in all directions) because most chemical etch rates are typically independent of direction and solely depend on diffusion.

Anisotropic etching is achieved in practice, e.g., by using reactive ion-assisted plasma etching, where active chemical etchant species (e.g., fluorine atoms) are generated in a plasma reactor along with reactive ions that are directed to strike the etch substrate perpendicular to its surface. In order to achieve anisotropy, a chemical composition is achieved in the plasma that allows the side walls of the feature to be protected from purely chemical etching by the deposition of a protective film. This film must be susceptible to being removed by the reactive ions that will be impinging primarily on the bottom surface of the trench being etched. The exposed substrate at the bottom of the feature is thus subjected to a combination of chemical and ion etching whereas the side walls are essentially untouched.

In order to achieve the desired results, the chemical composition of the plasma must be balanced correctly. It has been observed that better anisotropic etching can be achieved by balancing the formation of fluoro-organic polymeric deposits for side wall protection against the generation of the reactive etchant species that can remove exposed substrate. It has been observed that this balance may be obtained with fluorocarbons having reduced F to C ratios (hereinafter, F:C). For example, $C_4F_8$ (F:C=2) is a better anisotropic etch gas than $C_2F_6$ (F:C=3). Even lower F:C ratio gases have recently attracted attention for this application (e.g., $C_4F_6$, F:C=1.5 and $C_5F_8$; F:C=1.6). This trend has been described extensively in published literature. For example, see E. Stoffels, et al., "Polymerization in Fluorocarbon Plasmas," *Purazuma, Kaku Yugo Gakkaishi,* 1999, 75, pgs. 800–12. For future applications, plasma sources with even lower F:C ratios are desired.

It is known that when cyanuric fluoride ($C_3N_3F_3$) and other fluorinated aromatic amines are decomposed in a plasma, there is a substantial tendency to form polymeric deposits. This property was used to advantage in a plasma polymerization process described by Munro, et al. in Munro, et al., "An ESCA Study of the Inductively Coupled RF Plasma Polymerization of 2, 4, 6-Trifluoro-1,3,5-Triazine," *J. Polym. Sci.: Polym. Chem. Ed.* 1984, V. 22, pgs. 2661–66. This polymerization process was being studied in the interest of generating thin films for their own sake and not as a means of enhancing selectivity or profile control in a reactive ion etching application. The polymers deposited by Munro, et al. were composed of fluorine carbon and nitrogen, unlike conventional fluorocarbon based etching gases, which generate only carbon and fluorine-containing deposits.

In the prior art, anisotropic etch gases principally focused on etching silicon oxide from silicon substrates when masked with a patterned and developed polymeric photoresist. These gases generally were comprised of fluorocarbons and hydrofluorocarbons. Enhanced selectivity, and profile control were obtained by using source species having reduced F:C ratios and hence having a greater propensity to polymerize. In some cases, additive gases (e.g. carbon monoxide) are required to improve the etch selectivity, presumably by abstracting active fluorine-containing species formed in the plasma reactor. It is preferable to have a single-source compound for these processes in some cases.

In the prior art, U.S. Pat. No. 6,174,451(Hung et al.) is directed to an oxide etch process using one of three unsaturated 3- and 4-carbon fluorocarbons, specifically, hexafluorobutadiene, pentafluoropropylene, or trifluoropropyne. The unsaturated hydrofluorocarbon, together with argon, is excited into a high-density plasma in a reactor which inductively couples plasma source power into the reactor and RF biases the pedestal a pedestal electrode supporting the wafer being etched.

U.S. Pat. No. 5,843,847 (Pu et al.) is directed to a method for etching a dielectric layer on a substrate with high etching selectivity (i.e. the rate of etching of the dielectric layer to the rate of etching of the overlying resist layer or the underlying silicon, polysilicon, titanium silicide, or titanium nitride layer), low etch rate microloading, and high etch rates. Here, a substrate is placed in a process zone and a plasma is formed from the process gas in the process zone. The process gas comprises (i) fluorocarbon gas for etching the dielectric layer and for forming passivating deposits on the substrate, (ii) carbon-oxygen gas to enhance formation of passivating deposits on the substrate, and (iii) nitrogen containing gas for removing passivating deposits formed on the substrate.

U.S. Pat. No. 5,814,563 (Ding et al.) is also directed to a method for etching a dielectric layer on a substrate with high etching selectivity, low etch rate microloading, and high etch rates. The method here uses fluorohydrocarbon gas, $NH_3$-generating gas having a liquefaction temperature from about −60 degrees Celsius to about 20 degrees Celsius, and carbon-oxygen gas. In the method, a substrate having a dielectric layer with resist material thereon is placed in a process zone and a process gas is introduced into the process zone. The substrate is maintained at about +/−50 degrees Celsius of the liquefaction temperature. A plasma is formed from the process gas to etch the dielectric layer on the substrate at an etch rate of greater than 600 nm/minute and an etching selectivity ratio for etching dielectric relative to the underlying polysilicon of substantially ∞:1.

U.S. Pat. No. 5,770,098 (Araki et al.) is directed to an etching process for a semiconductor wafer where the process includes the steps of placing the object in a vacuum processing chamber, introducing an etching gas into the vacuum processing chamber, and applying electrical power to a pair of electrodes within the chamber by a high-frequency electrical power source. A mixed gas of carbon monoxide and a gas which does not contain hydrogen and which contains at least one element from the group IV elements and at least one element from group VII elements is used in the etching gas. At least 86% of an inert gas could be added to the etching gas. Here, the applicants state that this etching gas enables a high etching selectivity and prevents formation of fences.

It is principally desired to provide a method having enhanced properties for reactive ion etching for etching features into a substrate.

It is further desired to provide a method having enhanced properties for reactive ion etching for etching features into a substrate where the etching process has a high degree of anisotropy.

It is further desired to provide a method having enhanced properties for reactive ion etching for etching features into a substrate using halogenated heterocylic hydrocarbons, either alone or in combination with other etching compounds, to provide enhanced properties for reactive ion etching.

It is still further desired to provide a method having enhanced properties for reactive ion etching for etching features into a substrate that optimizes the process by judicious choice of etchant molecule alone.

It is further desired to provide a method having enhanced properties for reactive ion etching for etching features into a substrate where the polymeric deposits that form during the etching process are more reactive and hence more easily chemically removed after the etching process is complete.

Finally, it is desired to provide a method having enhanced properties for reactive ion etching for etching features into a substrate where the presence of the heteroatom makes the source material water-reactive or caustic-reactive and hence easily scrubbable such that emissions may be easily remediated.

BRIEF SUMMARY OF THE INVENTION

The present invention is directed to a method for etching features into a substrate by removing substrate material from selected areas while leaving the substrate substantially unaffected in other areas. The method first includes the steps of providing the substrate to be etched in a process chamber and providing a patterned mask on the substrate as a guide for selective removal of the substrate where the substrate has a mask area and mask-free area. A chemical species of halogenated heterocylic hydrocarbons is introduced into the process chamber and an excitation energy is applied to the process chamber to cause the chemical species to dissociate and form reactive ions and neutral species. An electric potential gradient is maintained in an area adjacent the substrate to impose directionality and anisotropy to the etch.

Preferably, the chemical species includes introducing halogenated heterocylic hydrocarbons alone or in combination with other etching compounds. The halogenated heterocyclic hydrocarbons may be fluorinated heterocyclic hydrocarbons. Additionally, it is preferable that the chemical species includes perfluorinated heteroaromatic amines such as perfluoropyridine, perfluororimidazole, perfluoropyrazine, perfluoropyrimidine, cyanuric fluoride, perfluoropyrrole, perfluoropyrazole, and perfluoropyridazine.

Preferably, the substrate is made from mono- or polycrystalline-silicon, silicon-germanium alloy, gallium arsenide or aluminum oxide and the substrate is coated with one or more thin film layers. Only a topmost layer of the one or more thin films layers may be selectively etched. The substrate coated with one or more films may include a film of silicon oxide, silicon nitride, silicon carbide, silicon oxycarbide, polycrystalline silicon, epitaxial silicon, indium oxide, indium phosphide, silicon-germanium, doped oxide glass, polyimide, or poly(arylene ether).

It is preferable that a pressure in the process chamber is provided that is at or below atmospheric pressure and preferably at or below 150 PA and more preferably between 1 and 100 Pa. The chemical species may be introduced into the process chamber as a vapor and/or with a carrier gas, e.g., helium, neon or nitrogen, and/or with additional etching agents, e.g., $CHF_3$, $CF_4$, $C_2F_6$, $C_3F_6$, $C_4F_8$, $C_4F_6$, or $C_5F_8$, and/or with a diluent gas (e.g., helium) to dilute and reduce the resonance time of the chemical species in the reactor, and/or with an oxygen-containing gas, e.g. $0_2$, $N_20$ or $C0_2$.

The step of applying excitation energy may include applying externally applied radiation, e.g. ultraviolet light, by applying a radio frequency electric field, or by generating the radio frequency electric field by a rapidly varying electric voltage between a substrate support and at least one wall of the chamber or by generating the radio frequency electric field by rapidly varying an electric voltage between a substrate support (i.e. a first electrode) and a second electrode disposed such that the substrate is held between the substrate support and the second electrode.

The step of applying excitation energy may include inducing a rapidly alternating potential in the chamber with an externally situated coil, or using a capacitively coupled plasma reactor, or using an inductively induced plasma reactor, or using an electron cyclotron resonance reactor, or applying an externally generated magnetic field to the etching chamber to help control motion of charged ions in the reaction chamber.

The step of maintaining the electric potential gradient in an area adjacent the substrate may include applying a voltage to a substrate support to force the electric potential gradient to the desired magnitude and polarity or this step may be accomplished by "self-biasing" that provide the electric potential gradient with a negative polarity to accelerate positive ions.

The step of maintaining the electric potential gradient may include modulating the electric potential gradient with a frequency between 0.1 kHz and 100 MHz.

DETAILED DESCRIPTION OF THE INVENTION

Figure 1:
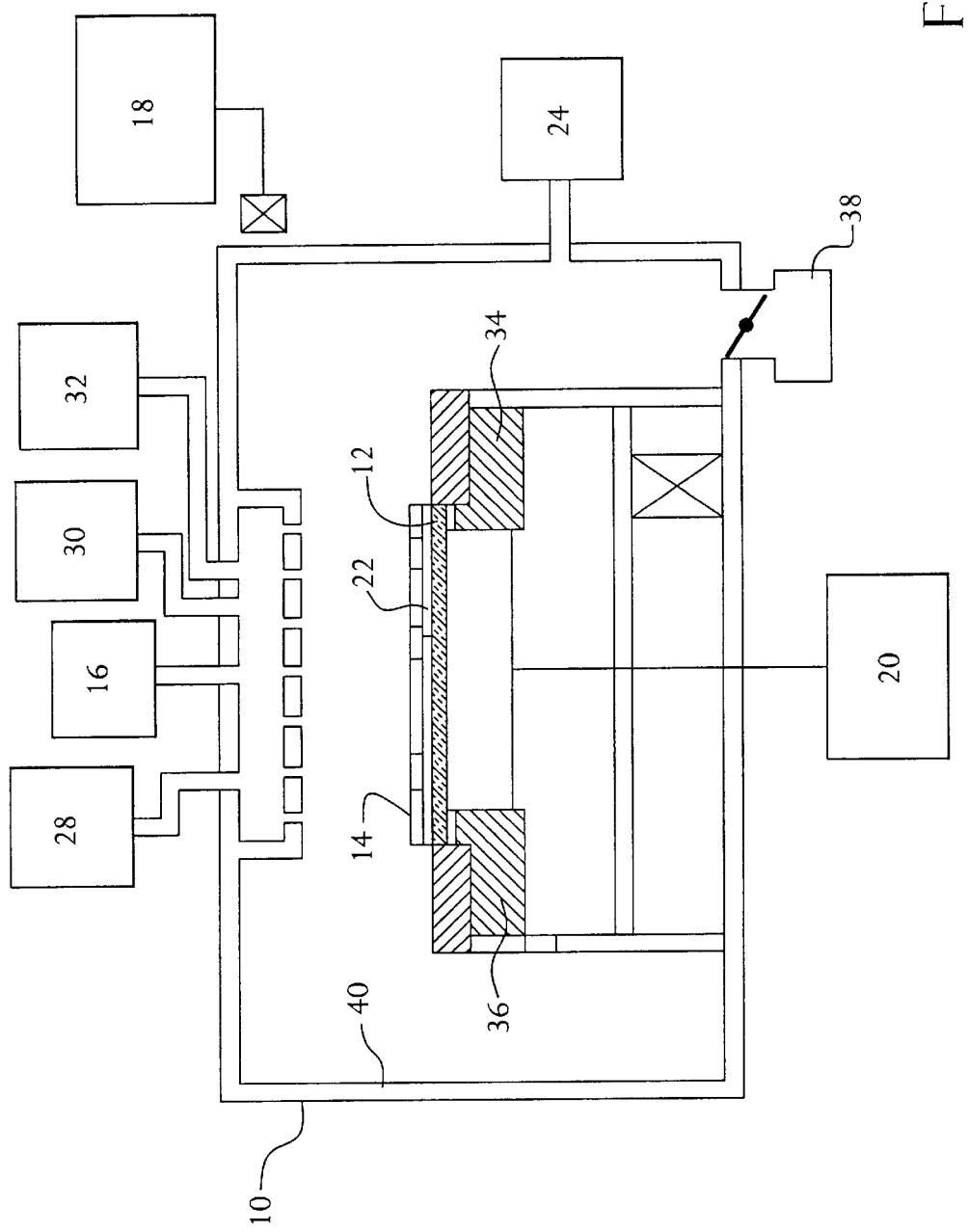
FIG. 1 is a simplified elevation view of a process chamber system for use with the method of the present invention.

The principle of this invention is to use halogenated heterocylic hydrocarbons, either alone or in combination with other etching compounds, to provide enhanced properties for reactive ion etching. More specifically, as identified below, the exemplary compounds of the present invention are perfluorinated heteroaromatic amines, for example: perfluoropyridine (I), perfluororimidazole (II), perfluoropyrazine (III), perfluoropyrimidine (IV) and cyanuric fluoride (V). Other examples may include perfluoropyrrole (VI), perfluoropyrazole (VII) perfluoropyridazine (VIII), and $C_3Cl_xF_{3-x}N_3$ (where x=0, 1, 2, 3 and mixtures thereof) Note that the fluorination may be on the carbon (as in I, III, IV and V below) or on the heteroatom (as in II below). Partially or fully chlorinated derivatives may also be employed (i.e. IX, X and XI). The prior art describes the preferred species to be fluorocarbons or hydrofluorocarbons. The compounds of the present invention have particularly favorable properties because of their enhanced film-forming abilities, the chemical reactivity of the resulting side wall films, and their enhanced ability to be readily remediated through caustic scrubbing.

The heteroatom-halogen bonds are typically more reactive than carbon-halogen bonds, and may contribute a greater concentration of reactive ions. The most preferred compound is V (see below).

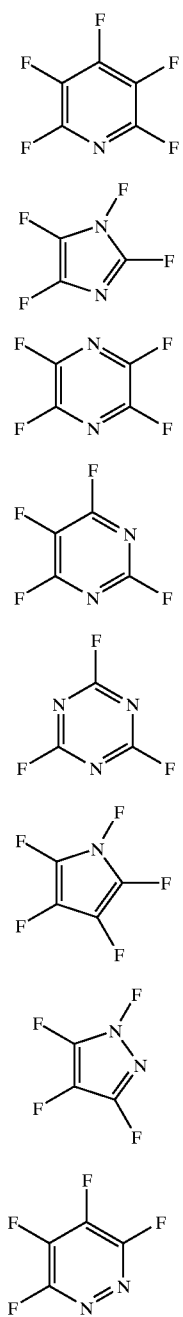

(I) (II) (III) (IV) (V) (VI) (VII) (VIII)

-continued

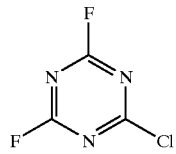

(IX)

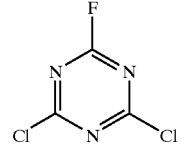

(X)

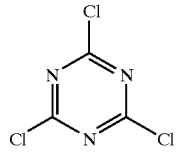

(XI)

By using the compounds disclosed in the present invention, the chemistry of the etching process may be optimized by the judicious choice of etchant molecule alone. By using these highly unsaturated molecules, the resulting reactive ions are, in turn, more highly unsaturated, thereby helping to enhance its protective effect on the developing feature by enhancing the film deposition efficiency. The heteroatoms in the etchant source molecules, such as nitrogen, will also be incorporated into the deposited films giving them unique and advantageous physicochemical properties. Furthermore, the relative rate of etching to polymerization may be effectively controlled by the power or intensity of the excitation process, made possible by the large propensity of these species to form polymeric films.

An additional benefit of using these species in this process is that the polymeric deposits which form during the etching process may be more reactive and hence more easily chemically removed after the etching process is complete. Unlike the deposits formed in the prior art which are fairly inert, the deposits of the present invention may be hydrolyzed in water or other aqueous strippers; in some instances minimizing the need to use more aggressive chemicals or processes. Also, unlike many of the compounds described in the prior art, the presence of the heteroatom makes the source material itself water-reactive or caustic-reactive and hence easily scrubbable (emissions may be easily remediated). This feature is particularly important since the compounds of the prior art must not be emitted into the atmosphere because they are themselves either toxic, flammable or implicated in global warming.

Referring now to the figure which depicts, in simplified from, a process chamber 10 in accordance with the present invention, the process to be conducted is as follows:

A substrate 12 will be patterned with a mask 14 (prior to insertion in the chamber 12) that the etching process will replicate by selectively removing the substrate 12 from the areas where there is no mask and leaving the substrate substantially unaffected in the area where the mask remains. The substrate 12 may be made of any suitable material, but preferably is made from mono- or polycrystalline-silicon, silicon-germanium alloy, gallium arsenide or aluminum oxide. The substrate 12 may be coated with one or more thin film layers 22. A critical feature of this process may be to selectively and precisely etch one or more of the topmost of these film layers. Examples of these films may include:

silicon oxide, silicon nitride, silicon carbide, silicon oxycarbide, polycrystalline silicon, epitaxial silicon, indium oxide, indium phosphide, silicon-germanium, doped oxide glass, polyimide, poly(arylene ether), and many more well-known to those skilled in the art.

The chemical species of the present invention would be introduced into the process chamber 10 (in which the substrate 12 is placed) through a process gas source 16. The pressure in the process chamber 10 is preferably at or below atmospheric pressure, more preferably at a pressure at or below 150 Pa and most preferably between 1 and 100 Pa as adjusted by vacuum source 24. These species are preferably introduced into the chamber 10 as a vapor, but could advantageously be delivered with a carrier gas such as helium, neon or nitrogen in some circumstances.

Additional etching agents, well known in the art, may be introduced in combination with the species of the present invention. Examples of these include $CHF_3$, $CF_4$, $C_2F_6$, $C_3F_6$, $C_4F8$, $C_4F_6$, and $C_5F_8$. Such combinations may be more desirable in some circumstances than any individual species. A diluent gas, preferably helium, added with the process gas or separately though diluent gas source 30, may be added to dilute and to reduce the resonance time of the gaseous species in the reactor. An oxygen-containing gas such as oxygen ($O_2$), nitrous oxide ($N_2O$) or carbon dioxide ($CO_2$) may be added to enhance the etching process, also added with the process gas or separately through oxygen containing gas source 32.

Excitation energy must be applied to the chamber, though excitation energy source 18 to cause the source species to dissociate and form reactive ions and neutral species. The excitation energy source 18 may be externally applied radiation (e.g., ultraviolet light) or more preferably, may be applied by striking a plasma in the chamber by applying a radio frequency electric field. This field may be generated by a rapidly varying electric voltage between a substrate support 34 and the walls 40 of the chamber, or this voltage may be applied between the substrate support (i.e. a first electrode 34) and a second electrode 36 disposed so that the substrate 12 is held between its support 34 and this second electrode 36. The aforementioned methods are collectively referred to as "capacitively coupled plasma" reactors. Alternatively, the excitation energy may be generated by inducing a rapidly alternating potential in the chamber with an externally situated coil, in the so-called "inductively coupled plasma" reactor. Other reactor types commonly used for reactive ions etching as are known by those skilled in the art, such as "electron cyclotron resonance" or ECR reactors may also be used. An externally generated magnetic field may also be applied to the etching chamber by an electrical field gradient source 20 to help control the motion of charged ions in the reaction chamber 10.

In order to impose directionality, and hence anisotropy to the etch, a bias (or electric potential gradient) must be formed in the area adjacent to the substrate 12. In some of the excitation methods, such as capacitively coupled plasma, a self-biasing may occur that can serve this purpose. An intentionally applied voltage to the substrate support may also be used with any of the excitation methods to force this bias to the desired magnitude. Although the bias may be set with the polarity either positive or negative, depending on whether etching is to be done principally by negative or positive ions, respectively, the bias will preferably be negative to accelerate positive ions. The biasing potential may be static or time dependent, but preferably will be modulated with a frequency between 0.1 kHz and 100 MHz.

Although illustrated and described herein with reference to specific embodiments, the present invention nevertheless is not intended to be limited to the details shown. Rather, various modifications may be made in the details within the scope and range of equivalents of the claims without departing from the spirit of the invention.

We claim:

1. A method for etching features into a substrate by removing substrate material from selected areas while leaving the substrate substantially unaffected in other areas, the method comprising the steps of:

(a) providing the substrate to be etched in a process chamber;

(b) providing a patterned mask on the substrate as a guide for selective removal of the substrate, the substrate having a mask area and mask-free area;

(c) introducing a chemical species of halogenated heterocyclic hydrocarbons into the process chamber;

(d) applying excitation energy to the process chamber to cause the chemical species to dissociate and form reactive ions and neutral species; and (e) maintaining an electric potential gradient in an area adjacent the substrate to impose directionality and anisotropy to the etch.

2. The method of claim 1, wherein the step of introducing the chemical species includes introducing halogenated heterocyclic hydrocarbons alone or in combination with other etching compounds.

3. The method of claim 1, wherein the step of introducing the chemical species of halogenated heterocyclic hydrocarbons includes introducing perfluorinated heteroaromatic amines.

4. The method of claim 1, wherein the step of introducing the chemical species includes introducing perfluorinated heteroaromatic amines selected from the group consisting of perfluoropyridine, perfluororimidazole, perfluoropyrazine, perfluoropyrimidine, cyanuric fluoride, perfluoropyrrole, perfluoropyrazole, and perfluoropyridazine.

5. The method of claim 1, wherein the substrate is a member selected from the group consisting of monocrystalline-silicon, polycrystalline-silicon, silicon-germanium alloy, gallium arsenide and aluminum oxide.

6. The method of claim 1, wherein the step of providing the substrate includes providing the substrate coated with one or more thin films layers.

7. The method of claim 6, including the step of selectively etching only a topmost layer of the one or more thin films layers.

8. The method of claim 1, wherein the step of providing the substrate coated with one or more films includes providing the substrate coated with a film selected from the group consisting of silicon oxide, silicon nitride, silicon carbide, silicon oxycarbide, polycrystalline silicon, epitaxial silicon, indium oxide, indium phosphide, silicon-germanium, doped oxide glass, polyimide, and poly(arylene ether).

9. The method of claim 1, including the step of providing a pressure in the process chamber at or below atmospheric pressure.

10. The method of claim 9, wherein the step of providing a pressure in the process chamber includes providing a pressure at or below 150 Pa.

11. The method of claim 9, wherein the step of providing a pressure in the process chamber includes providing a pressure between 1 and 100 Pa.

12. The method of claim 1, wherein the step of introducing the chemical species into the process chamber includes introducing the chemical species as a vapor.

13. The method of claim 1, wherein the step of introducing the chemical species into the process chamber includes introducing the chemical species with a carrier gas.

14. The method of claim 13, wherein the step of introducing the chemical species into the process chamber includes introducing the chemical species with a carrier group selected from the group consisting of helium, neon or nitrogen.

15. The method of claim 1, including the step of providing additional etching agents in combination with the chemical species.

16. The method of claim 15, wherein the step of providing additional etching agents in combination with the chemical species includes providing an etching agent selected from the group consisting of $CHF_3$, $CF_4$, $C_2F_6$, $C_3F_6$, $C_4F_8$, $C_4F_6$, and $C_5F_8$ as the additional etching agent.

17. The method of claim 1, including the step of providing a diluent gas to dilute and reduce the resonance time of the chemical species in the reactor.

18. The method of claim 17, wherein the step of providing the diluent gas includes providing helium gas.

19. The method of claim 1, including the step of providing an oxygen-containing gas to the process chamber.

20. The method of claim 19, wherein the step of providing an oxygen-containing gas to the process chamber includes providing an oxygen containing gas selected from the group consisting of $O_2$, $N_2O$ and $CO_2$ to enhance the etching process.

21. The method of claim 1, wherein the step of applying excitation energy includes applying externally applied radiation.

22. The method of claim 21, wherein the step including applying externally applied radiation includes applying ultraviolet light.

23. The method of claim 11, wherein the step including applying externally applied radiation includes striking a plasma in the process chamber by applying a radio frequency electric field.

24. The method of claim 23, wherein the step including providing the radio frequency electric field includes generating the radio frequency electric field by a rapidly varying electric voltage between a substrate support and at least one wall of the chamber.

25. The method of claim 23, wherein the step including providing the radio frequency electric field includes generating the radio frequency electric field by rapidly varying an electric voltage between a substrate support and an electrode disposed wherein the substrate is held between the substrate support and the electrode.

26. The method of claim 1, wherein the step of applying excitation energy includes inducing a rapidly alternating potential in the chamber with an externally situated coil.

27. The method of claim 1, wherein the step of providing excitation energy includes using a capacitively coupled plasma reactor.

28. The method of claim 1, wherein the step of providing excitation energy includes using an inductively induced plasma reactor.

29. The method of claim 1, wherein the step of providing excitation energy includes using an electron cyclotron resonance reactor.

30. The method of claim 1, wherein the step of providing excitation energy includes applying an externally generated magnetic field to the etching chamber to help control motion of charged ions in the reaction chamber.

31. The method of claim 1, wherein the step of maintaining the electric potential gradient in an area adjacent the substrate includes applying a voltage to a substrate support to force the electric potential gradient to a desired magnitude and polarity.

32. The method of claim 1, wherein the step of maintaining the electric potential gradient includes providing the electric potential gradient with a negative polarity to accelerate positive ions.

33. The method of claim 1, wherein the step of maintaining the electric potential gradient includes modulating the electric potential gradient with a frequency between 0.1 kHz and 100 MHz.

34. The method of claim 1, wherein the step of introducing a chemical species of halogenated heterocyclic hydrocarbons into the process chamber includes introducing a chemical species of fluorinated heterocyclic hydrocarbons into the process chamber.

* * * * *